United States Patent
Dudley (10) Patent No.: US 7,195,404 B1
(45) Date of Patent: Mar. 27, 2007

(54) FIBER OPTIC TRANSCEIVER MODULE WITH ELECTROMAGNETIC INTERFERENCE ABSORBING MATERIAL AND METHOD FOR MAKING THE MODULE

(75) Inventor: James J. Dudley, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/368,250

(22) Filed: Mar. 3, 2006

(51) Int. Cl.
*G02B 6/36* (2006.01)

(52) U.S. Cl. .................................................. 385/92

(58) Field of Classification Search ............... None
See application file for complete search history.

(56) References Cited

U.S. PATENT DOCUMENTS

| | | | |
|---|---|---|---|
| 4,868,889 A * | 9/1989 | McGann et al. ............ 455/126 |
| 7,001,217 B2 | 2/2006 | Bright et al. |
| 2005/0152701 A1* | 7/2005 | Liu et al. ..................... 398/135 |
| 2005/0213895 A1* | 9/2005 | Sabbatino .................... 385/92 |

* cited by examiner

*Primary Examiner*—Michelle Connelly-Cushwa
*Assistant Examiner*—Chris Chu (57) ABSTRACT

A fiber optic module and method for making the module uses an electromagnetic interference (EMI) absorbing material, which is positioned within an interior region defined by a housing of the module. The EMI absorbing material has electrical properties to absorb electromagnetic radiation to reduce EMI emissions of the module.

17 Claims, 5 Drawing Sheets

FIG.6

FIBER OPTIC TRANSCEIVER MODULE WITH ELECTROMAGNETIC INTERFERENCE ABSORBING MATERIAL AND METHOD FOR MAKING THE MODULE

BACKGROUND OF THE INVENTION

Fiber optic cables are widely used to transmit and receive data between equipments, and sometimes, even within the same equipment. Fiber optic cables offer several advantages over conventional metal wires, i.e., copper wires. For example, fiber optic cables are resistant to electromagnetic interference and have higher data transmission rates and bandwidth capabilities.

The use of fiber optic cables requires optical signals, which are transmitted through the fiber optic cables, to be converted from and to electrical signals to interface with electrical components that perform various functions, such as encoding, decoding, serializing, deserializing and clock recovery. Thus, optoelectronic equipments require optical transmitters to convert outgoing electrical signal into optical signals to be transmitted on the fiber optic cables and optical receivers to convert incoming optical signals on the fiber optic cables into electrical signal. The optical transmitters and receivers are usually packaged as individual components, commonly known as transmit optical sub-assemblies (TOSAs) and receive optical sub-assemblies (ROSAs), respectively. Typically, a TOSA and a ROSA are assembled together in a fiber optic transceiver module, which can be installed in an optoelectronic equipment. Different types of fiber optic transceiver modules can vary in size and shape, as well as other features of the modules, which usually conform to some standard or Multi-Source Agreement (MSA), such as the MSA for Small Form Factor Pluggable (SFP) transceivers.

A concern with fiber optic transceiver modules is the amount of electromagnetic interference (EMI) emissions generated by the modules. EMI emissions for digital electronic devices are regulated by agencies, such as the Federal Communications Commission (FCC) in US and the International Special Committee on Radio Interference (CISPR) in Europe. Since an optoelectronic equipment can include many fiber optic transceiver modules, the EMI emissions from the fiber optic transceiver modules must be minimized to conform to the required regulations. Furthermore, EMI emissions from fiber optic transceiver modules can interfere with the operation of surrounding electrical components.

Conventional solutions to reduce EMI emissions from a fiber optic transceiver module include placing a metal collar with spring fingers around the module or placing an EMI gasket around the module. However, these metal collars or EMI gaskets may not sufficiently reduce EMI emissions from the modules, and may cause mechanical interaction problems with the cages of optoelectronic equipments into which the modules are placed. Furthermore, since optoelectronic equipments may use differently designed cages, the metal collars and EMI gaskets may not work well for all types of cages. In addition, metal collars are not readily available and must be custom designed, which increases cost and complexity to the manufacturing of the modules.

In view of the above issues, what is needed is a fiber optic transceiver module with an EMI reducing feature that addresses at least some of these issues.

SUMMARY OF THE INVENTION

A fiber optic module and method for making the module uses an electromagnetic interference (EMI) absorbing material, which is positioned within an interior region defined by a housing of the module. The EMI absorbing material has electrical properties to absorb electromagnetic radiation to reduce EMI emissions of the module. Since the EMI absorbing material is positioned internally within the housing, the mechanical interaction problems associated with conventional EMI reducing features, e.g., metal collars and EMI gaskets, can be avoided. Furthermore, the use of EMI absorbing material within the housing can better reduce the EMI emissions of the module as compared to the conventional EMI reducing features.

A fiber optic module in accordance with an embodiment of the invention comprises a housing configured to provide an interior region defined by the housing, a printed circuit board positioned within the interior region provided by the housing, one or several optoelectronic device(s) electrically connected to the printed circuit board and an EMI absorbing material positioned within the interior region provided by the housing. The EMI absorbing material has electrical properties to absorb electromagnetic radiation to reduce EMI emissions of the module A fiber optic transceiver module in accordance with an embodiment of the invention comprises a housing configured to provide an interior region defined by the housing, a printed circuit board positioned within the interior region provided by the housing, a transmit optical subassembly electrically connected to the printed circuit board, a receive optical subassembly electrically connected to the printed circuit board and an EMI absorbing material positioned within the interior region provided by the housing. The EMI absorbing material has electrical properties to absorb electromagnetic radiation to reduce EMI emissions of the module.

A method for making a fiber optic module in accordance with an embodiment of the invention comprises providing a housing of the module, which is configured to provide an interior region defined by the housing, providing a printed circuit board, providing an optoelectronic device, providing an EMI absorbing material, which has electrical properties to absorb electromagnetic radiation, and assembling the housing, the printed circuit board, the optoelectronic device and the EMI absorbing material to produce the module, including positioning the EMI absorbing material within the interior region provided by the housing to reduce EMI emissions of the module.

Other aspects and advantages of the present invention will become apparent from the following detailed description, taken in conjunction with the accompanying drawings, illustrated by way of example of the principles of the invention.

DETAILED DESCRIPTION

Figure 1:
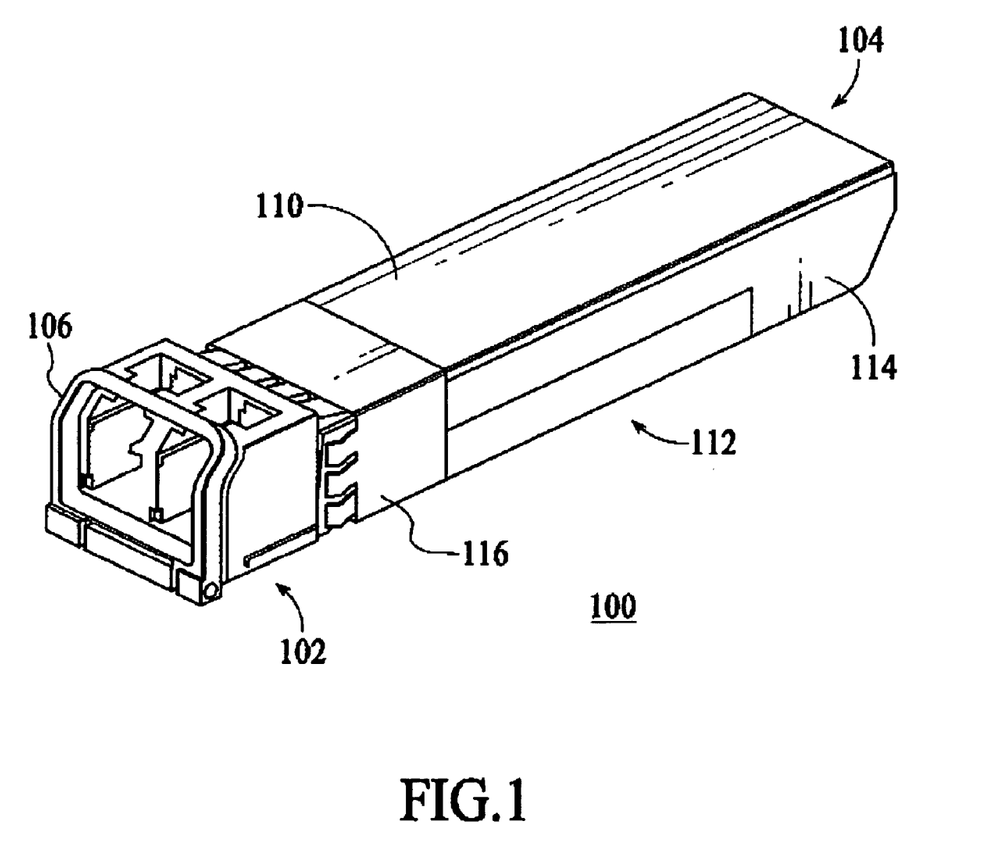
FIG. 1 is a perspective view of a fiber optic transceiver module in accordance with an embodiment of the invention.

With reference to FIG. 1, a fiber optic transceiver module 100 in accordance with an embodiment of the invention is described. As described in more detail below, the fiber optic transceiver module 100 includes a feature to reduce electromagnetic interference (EMI) emissions of the module. Unlike conventional EMI reducing features, such as metal collars and EMI gaskets, the EMI reducing feature of the fiber optic transceiver module 100 is internal to the module. Thus, the fiber optic transceiver module 100 does not suffer from mechanical interaction problems associated with the use of conventional EMI reducing features. Furthermore, the EMI reducing feature of the fiber optic transceiver module 100 can more significantly reduce EMI emissions of the module than conventional EMI reducing features. The EMI reducing feature of the fiber optic transceiver module may or may not be used in conjunction with one or more conventional EMI reducing features. Although the fiber optic module 100 is described herein as a fiber optic transceiver module, the fiber optic module may be a fiber optic transmitter module or a fiber optic receiver module.

As shown in FIG. 1, the fiber optic transceiver module 100 includes a connector interface assembly 102 and a housing 104. The connector interface assembly 102 and the housing 104 define the size and shape of the fiber optic transceiver module 100. In an embodiment, the size and shape of the fiber optic transceiver module 100 substantially conforms to the Multi-Source Agreement for Small Form Factor Pluggable (SFP) transceivers. Thus, in this embodiment, the fiber optic transceiver module 100 is a pluggable fiber optic module. However, in other embodiments, the fiber optic transceiver module 100 may conform to other standards or MSAs.

The connector interface assembly 102 is designed to receive two connectors of fiber optic cables (not shown) so that the fiber optic cables can be optically connected to the fiber optic transceiver module 100. The connector interface assembly 102 has two ports into which the fiber optical cable connectors can be inserted. The connector interface assembly 102 includes a releasing mechanism 106 to allow a user to easily remove the fiber optic transceiver module 100 from an optoelectronic equipment (not shown) into which the module was inserted.

Figure 2:
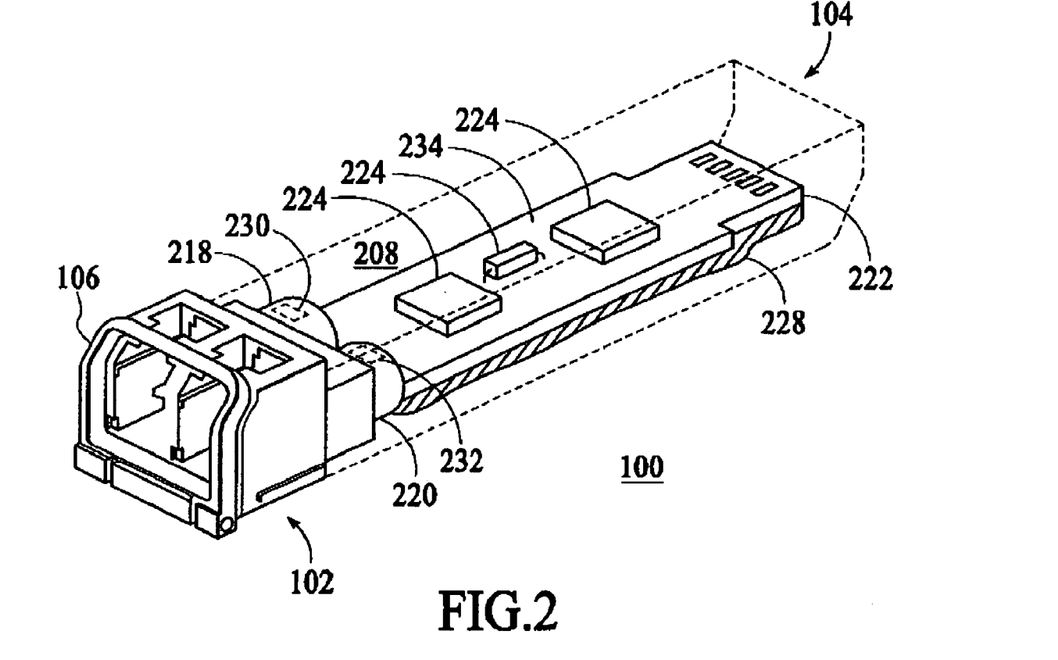
FIG. 2 is the same perspective view of the fiber optic transceiver module as FIG. 1, except the housing of the module is shown in phantom.

The housing 104 is attached to the connector interface assembly 102 and is configured as a shell to provide a protective cover for the internal components of the fiber optic transceiver module 100. The housing 104 has four main sides that substantially define an interior rectangular region 208 within the fiber optic transceiver module 100, as shown in FIG. 2. In FIG. 2, the housing 104 is illustrated in phantom to show the internal components of the fiber optic transceiver module. The housing 104 may be composed of multiple parts that are assembled to form a single unit. The housing 104 may include a top cover 110 and a bottom cover 112, which are attached to a frame 114 with side surfaces. However, in other embodiments, the housing 104 may be formed of fewer or more parts. Alternatively, the housing 104 may be a single integral structure. In an embodiment, the housing 104 is made of a metallic material to shield some of the EMI radiation emitted from the internal electrical components of the fiber optic transceiver module 100. However, in other embodiments, the housing 104 can be made of any material or combination of materials.

As shown in FIG. 1, the fiber optic transceiver module 100 includes an optional metal collar 116 with spring fingers. The metal collar 116 is positioned around the housing 104 to reduce the EMI radiation emitted from the internal electrical components of the fiber optic transceiver module 100. The metal collar 116 is a well-known conventional EMI reducing feature, and thus, is not further described herein. The fiber optic transceiver module 100 may include other conventional EMI reducing feature or features.

As shown in FIG. 2, the internal components of the fiber optic transceiver module 100 include a transmit optical sub-assembly (TOSA) 218, a receive optical sub-assembly (ROSA) 220, a printed circuit board (PCB) 222, a number of electrical components 224 and the internal EMI reducing feature in the form of a layer of EMI absorbing material 228. The TOSA 218 and the ROSA 220 are designed to interface with the fiber optic cables connected to the fiber optic transceiver module 100. The TOSA 218 operates to generate optical signals in response to received electrical signals, while the ROSA 220 operates to generate electrical signals in response to received optical signals. The TOSA 218 and the ROSA 220 are well known in the art, and thus, are described briefly herein. The TOSA 218 includes at least an optoelectronic device 230 that emits light, e.g., a vertical cavity surface emitting laser, to generate optical signals in response to received electrical signals, i.e., driving signals. The ROSA 220 includes at least an optoelectronic device 232 that produces photocurrent, e.g., a photodiode, to generate electrical signals in response to received optical signals.

Figure 3:
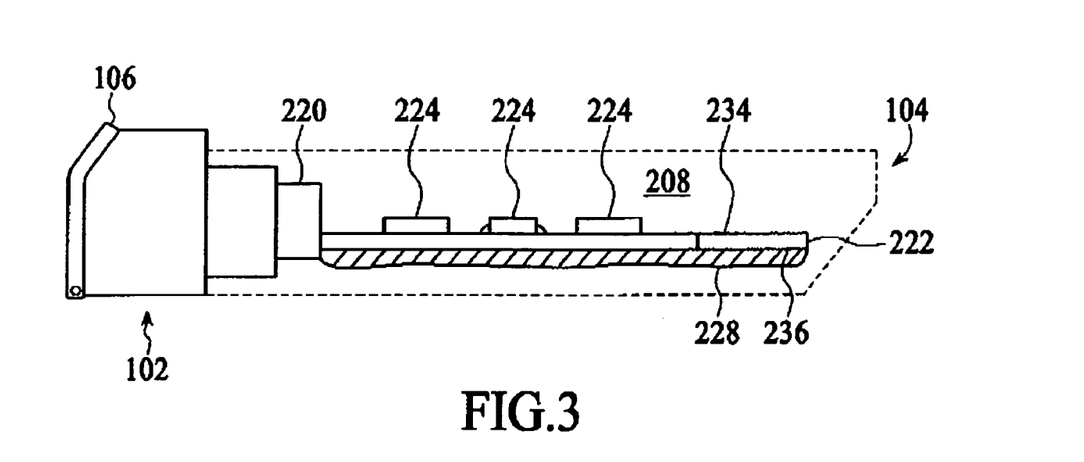
FIG. 3 is a side view of the fiber optic transceiver module of FIG. 1 with the housing of the module illustrated in phantom.

The TOSA 218 and the ROSA 220 are electrically connected to the PCB 222. In addition, the electrical components 224 are mounted onto a surface 234 of the PCB 222. The electrical components 224 may include a driver integrated circuit (IC) chip that provides the driving signals to the TOSA 218, an amplifier IC chip that amplifies and quantizes the electrical signals from the ROSA 220, and a microcontroller IC chip. Although only three electrical components 224 are shown in FIG. 2, the fiber optic transceiver module 100 may include additional IC chips and other electronic components mounted on the PCB 222. Alternatively, the fiber optic transceiver module 100 may include one or more system-on-chips, instead of different application specific IC chips. The surface 234 of the PCB 222 onto which the electrical components 224 are mounted will be referred to herein as the major surface. As used herein, the major surface 234 of the PCB 222 is the surface onto which all or majority of electrical components are mounted. As shown in FIG. 3, which is a side view of the fiber optic transceiver module 100 with the housing 104 illustrated in phantom, the other surface 236 of the PCB 222 opposite to the major surface 234 will be referred to herein as the minor surface. The minor surface 236 of the PCB is the surface of the PCB 222 adjacent to the bottom cover 112 or the bottom side of the PCB. In this embodiment, no electrical component is mounted onto the minor surface 236 of the PCB 222. However, in other embodiments, one or more electrical components may be mounted onto the minor surface 236 of the PCB 222.

The layer of EMI absorbing material 228 is positioned between the minor surface 236 of the PCB 222 and the bottom cover 112 or the bottom side of the housing 104.

Thus, the layer of EMI absorbing material 228 is positioned within the interior rectangular region 208 defined by the housing 104. The layer of EMI absorbing material 228 can be thin or thick. In an embodiment, the layer of EMI absorbing material 228 is a layer formed on the minor surface 236 of the PCB 222 by applying the EMI absorbing material onto the minor surface of the PCB. The EMI absorbing material 228 can be applied to the entire minor surface 236 of the PCB 222. Alternatively, the EMI absorbing material 228 can be applied to some of the minor surface 236 of the PCB 222, leaving one or more areas free of the EMI absorbing material as needed. In an alternative embodiment, the layer of EMI absorbing material 228 is a layer formed on the inside surface of the bottom cover 112 or the bottom side of the housing 104 by applying the EMI absorbing material onto at least some of the inside surface. In these embodiments, the EMI absorbing material 228 can be any curable material with embedded metal particles, which has electrical properties to absorb electromagnetic radiation. As an example, the EMI absorbing material 228 may be a room temperature vulcanizing (RTV) silicone rubber material having microwave absorbing properties, which also absorbs EMI emissions, such as those sold by Emerson and Cuming Microwave Products as "CRS-117" and "CRS-124". In an alternative embodiment, the layer of EMI absorbing material 228 may be formed of a sheet (or sheets) of EMI absorbing material, which is positioned between the minor surface 236 of the PCB 228 and the bottom cover 112 or the bottom side of the housing 104. The sheet of EMI absorbing material 228 can be any rigid or flexible sheet having electrical properties to absorb electromagnetic radiation. As an example, the sheet of EMI absorbing material 228 may be a rigid sheet of magnetically loaded epoxide material having microwave absorbing properties, which also absorbs EMI emissions, such as those sold by Emerson and Cuming Microwave Products as "MF-110", "MF-112", "MF-114", "MF-116", "MF-117", "MF-124", "MR-175" and "MR-190", which have similar electrical properties as "CRS-117" and "CRS-124".

Although the layer of EMI absorbing material 228 is illustrated and described herein as being positioned between the minor surface of the PCB 222 and the bottom cover 112 or the bottom side of the housing 104, the EMI absorbing layer may be internally positioned within the housing 104 at other locations. However, improper placement of the layer of EMI absorbing material 228 can degrade the signal integrity of the fiber optic transceiver module 100, can have no impact on the level of EMI emissions, or can increase the level of EMI emissions. As an example, contrary to a common expectation, positioning the layer of EMI absorbing material 228 above the major surface 234 of the PCB 222 and the top cover 110 or the top side of the housing 104 can result in increased level of EMI emissions by the fiber optic transceiver module 100.

Figure 4A:
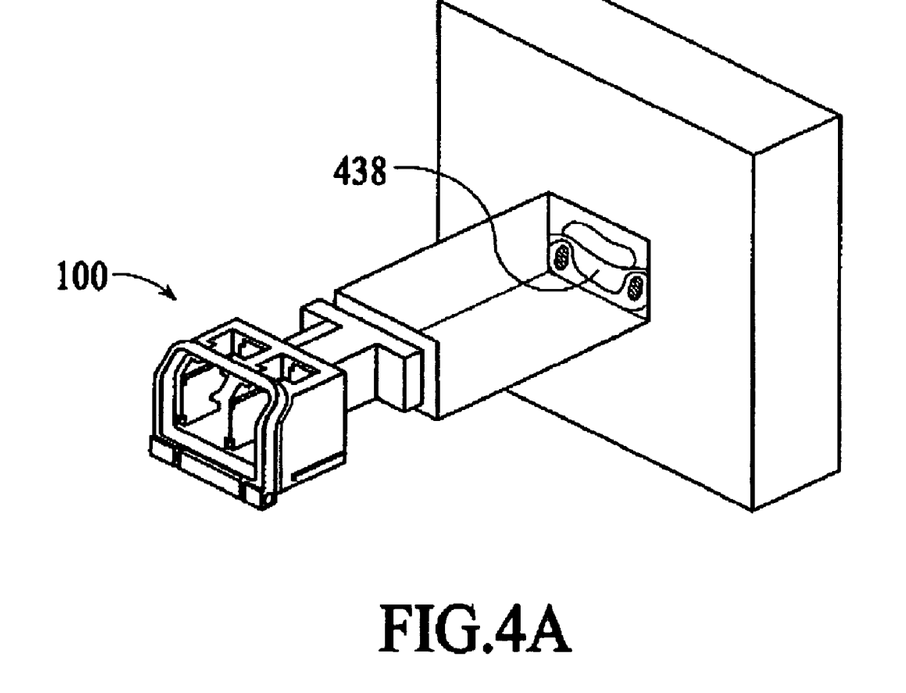
FIGS. 4A and 4B show electrical fields within the fiber optic transceiver module of FIG. 1.
Figure 4B:
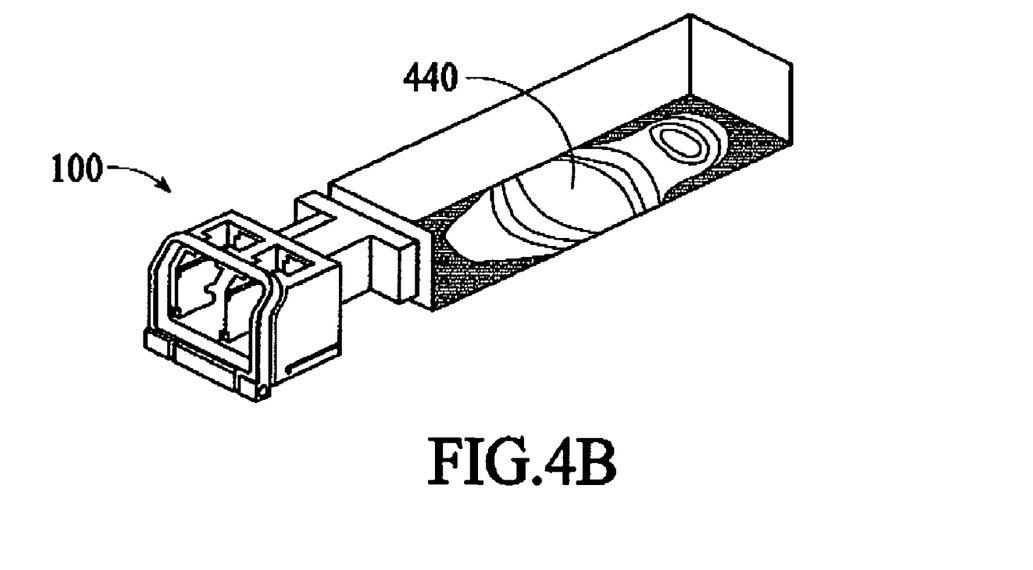

Simulations confirm that positioning the layer of EMI absorbing material 228 between the minor surface 236 of the PCB 222 and the bottom cover 112 or the bottom side of the housing 104 is effective. In FIGS. 4A and 4B, the electric fields in the fiber optic transceiver module 100 are shown. FIG. 4A shows the electric fields along a vertical cross-section 438 of the fiber optic transceiver module 100. FIG. 4B shows the electric fields along a horizontal cross-section 440 of the fiber optic transceiver module 100 near the bottom of the module. Higher electric fields are shown in the cross-sections 438 and 440 as dark areas. These simulations show EMI cavity resonance between the bottom cover 112 or the bottom side of the housing 104 and the PCB 222. Other simulations also show peaks in the surface current on the bottom cover 112 or the bottom side of the housing 104. Thus, by placing the layer of EMI absorbing material 228 where these peaks are, the EMI emissions are reduced.

Figure 5:
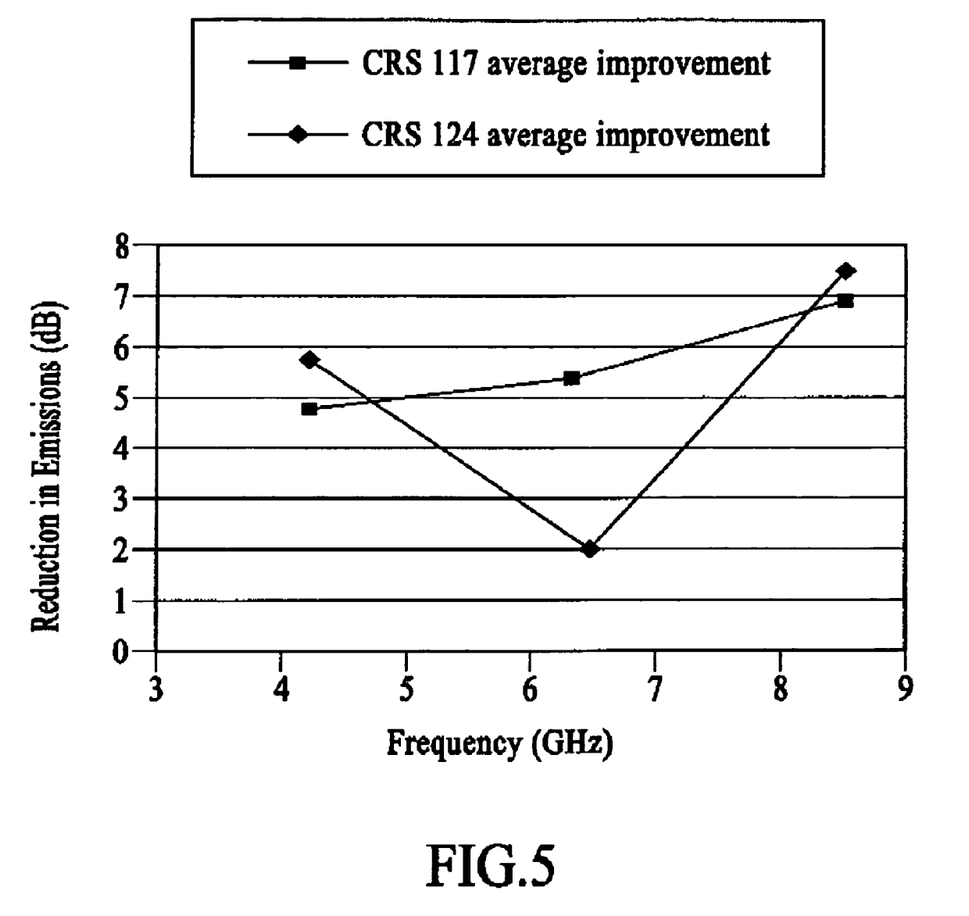
FIG. 5 is a graph showing the reduction in EMI emissions over different frequencies for fiber optic transceiver modules in accordance with an embodiment of the invention.

FIG. 5 is a graph showing the reduction in EMI emissions over different frequencies for fiber optic transceiver modules using CRS-117 and CRS-124 in accordance with an embodiment of the invention. The graph of FIG. 5 is derived from test results on fiber optic transceiver modules, product number AFCT-57R5APZ, of Avago Technologies Inc. As shown in FIG. 5, these test results show average reduction in EMI emissions from 2 to 7 dB, depending on the frequency of measurement. Similar results were measured on fiber optic transceiver modules, product number AFBR-5710, of Avago Technologies Inc.

Figure 6:
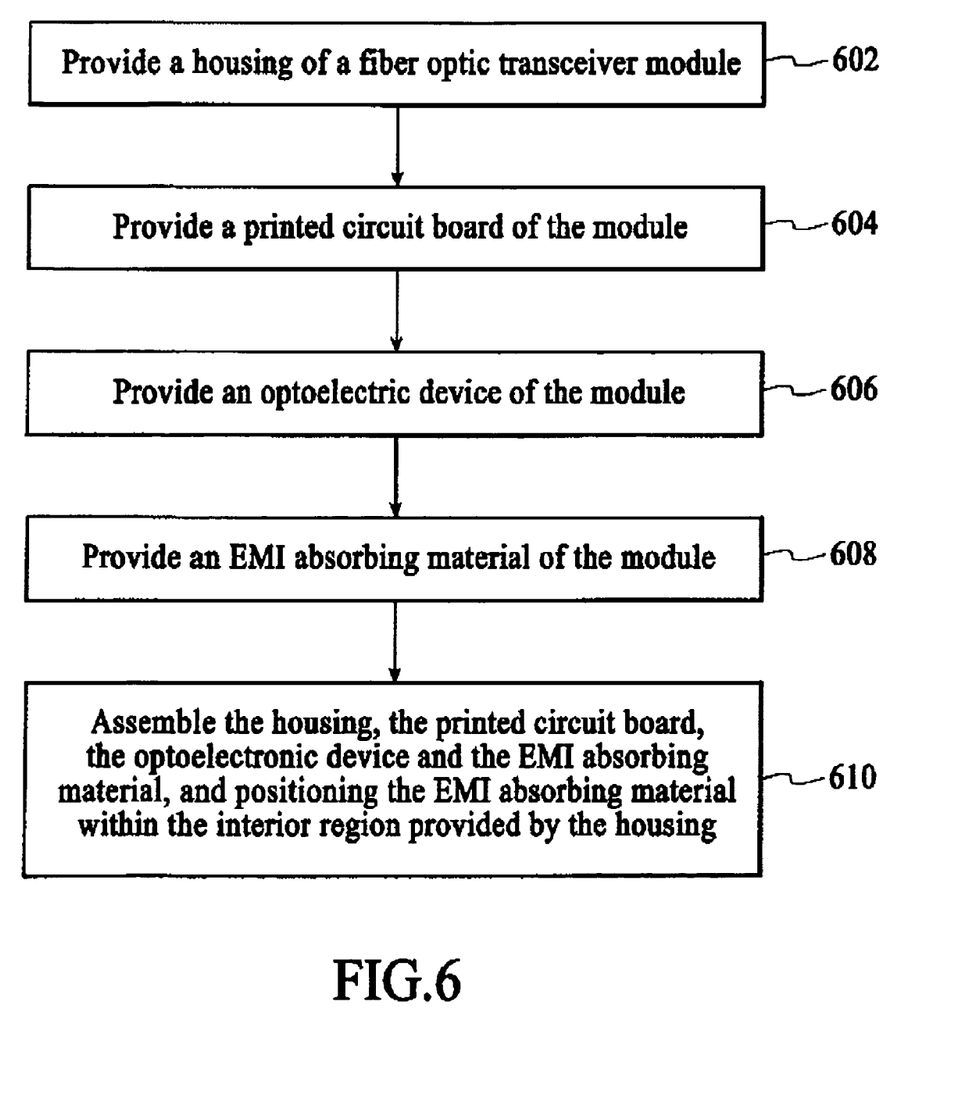
FIG. 6 is a flow diagram of a method for making a fiber optic transceiver module in accordance with an embodiment of the invention.

A method for making a fiber optic transceiver module in accordance with an embodiment of the invention is described with reference to FIG. 6. At block 602, a housing of the module is provided. The housing is configured to provide an interior region defined by the sides of the housing. At block 604, a printed circuit board of the module is provided. At block 606, an optoelectronic device of the module is provided. At block 608, an electromagnetic interference absorbing material of the module is provided. The electromagnetic interference absorbing material has electrical properties to absorb electromagnetic radiation. At block 610, the housing, the printed circuit board, the optoelectronic device and the electromagnetic interference absorbing material are assembled to produce the module. At block 610, the electromagnetic interference absorbing material is also positioned within the interior region provided by the housing to reduce electromagnetic interference emissions of the module.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A fiber optic module comprising:
   a housing configured to provide an interior region defined by said housing;
   a printed circuit board positioned within said interior region provided by said housing, said printed circuit board including a major surface onto which a majority of electrical components are mounted and a minor surface opposite of said major surface;
   an optoelectronic device electrically connected to said printed circuit board; and
   an electromagnetic interference absorbing material positioned within said interior region provided by said housing, said electromagnetic interference absorbing material being exclusively positioned directly next to a side of said housing between said minor surface of said printed circuit board and said side of said housing, said electromagnetic interference absorbing material having electrical properties to absorb electromagnetic radiation to reduce electromagnetic interference emissions of said module.

2. The module of claim 1 wherein said electromagnetic interference absorbing material is configured as a layer of said electromagnetic interference absorbing material.

3. The module of claim 1 wherein said electromagnetic interference absorbing material includes a room temperature vulcanizing silicone rubber material having microwave absorbing properties.

4. The module of claim 1 wherein said electromagnetic interference absorbing material is configured as a sheet of said electromagnetic interference absorbing material.

5. The module of claim 1 wherein said electromagnetic interference absorbing material includes a magnetically loaded epoxide material having microwave absorbing properties.

6. The module of claim 1 further comprising a transmit optical sub-assembly electrically connected to said printed circuit board.

7. The module of claim 1 further comprising a receive optical sub-assembly electrically connected to said printed circuit board.

8. The module of claim 1 further comprising a connector interface structure attached to said housing, said connector interface structure being configured to interface with a fiber optic cable.

9. The module of claim 1 wherein said housing substantially conforms to the Multi Source Agreement for Small Form Factor Pluggable (SFP) transceivers.

10. A fiber optic transceiver module comprising:
    a housing configured to provide an interior region defined by said housing;
    a printed circuit board positioned within said interior region provided by said housing, said printed circuit board including a major surface onto which a majority of electrical components are mounted and a minor surface opposite of said major surface;
    a transmit optical subassembly electrically connected to said printed circuit board;
    a receive optical subassembly electrically connected to said printed circuit board; and
    an electromagnetic interference absorbing material positioned within said interior region provided by said housing, said electromagnetic interference absorbing material being exclusively positioned directly next to a side of said housing between said minor surface of said printed circuit board and said side of said housing, said electromagnetic interference absorbing material having electrical properties to absorb electromagnetic radiation to reduce electromagnetic interference emissions of said module.

11. The module of claim 10 wherein said electromagnetic interference absorbing material is configured as a layer of said electromagnetic interference absorbing material.

12. The module of claim 10 wherein said electromagnetic interference absorbing material includes a room temperature vulcanizing silicone rubber material having microwave absorbing properties.

13. The module of claim 10 wherein said electromagnetic interference absorbing material is configured as a sheet of said electromagnetic interference absorbing material.

14. The module of claim 10 wherein said electromagnetic inference absorbing material includes a magnetically loaded epoxide material having microwave absorbing properties.

15. A method for making a fiber optic module, said method comprising:
    providing a housing of said module, said housing being configured to provide an interior region defined by said housing;
    providing a printed circuit board, said printed circuit board including a major surface onto which a majority of electrical components are mounted and a minor surface opposite of said major surface;
    providing an optoelectronic device;
    providing an electromagnetic interference absorbing material, said electromagnetic interference absorbing material having electrical properties to absorb electromagnetic radiation; and
    assembling said housing, said printed circuit board, said optoelectronic device and said electromagnetic interference absorbing material to produce said module, including positioning said electromagnetic interference absorbing material within said interior region provided by said housing to reduce electromagnetic interference emissions of said module, said electromagnetic interference absorbing material being exclusively positioned directly next to a side of said housing between said minor surface of said printed circuit board and said side of said housing.

16. The method of claim 15 wherein said electromagnetic interference absorbing material includes a room temperature vulcanizing silicone rubber material having microwave absorbing properties.

17. The method of claim 15 wherein said electromagnetic interference absorbing material includes a magnetically loaded epoxide material having microwave absorbing properties.

* * * * *

UNITED STATES PATENT AND TRADEMARK OFFICE
CERTIFICATE OF CORRECTION

PATENT NO. : 7,195,404 B1 Page 1 of 1
APPLICATION NO. : 11/368250
DATED : March 27, 2007
INVENTOR(S) : James Dudley

It is certified that error appears in the above-identified patent and that said Letters Patent is hereby corrected as shown below:

Col. 8 Line 9 In Claim 14, delete "inference" and insert -- interference --, therefor.

Col. 8 Line 12 In Claim 15, after "comprising" delete ":" and insert -- ; --, therefor.

Signed and Sealed this

Second Day of December, 2008

JON W. DUDAS
*Director of the United States Patent and Trademark Office*